(12) United States Patent
Hsu (10) Patent No.: US 10,455,725 B1
(45) Date of Patent: Oct. 22, 2019

(54) SECURING DEVICE FOR SLIDE RAIL OF SERVO CABINET

(71) Applicant: Kunshan Lemtech Slide Technology Co., Ltd., Kunshan, Jiangsu Province (CN)

(72) Inventor: Chi Feng Hsu, Taipei (TW)

(73) Assignee: Kunshan Lemtech Slide Technology Co., Ltd., Kunshan (CN)

( * ) Notice: Subject to any disclaimer, the term of this patent is extended or adjusted under 35 U.S.C. 154(b) by 0 days.

(21) Appl. No.: 16/374,832

(22) Filed: Apr. 4, 2019

Related U.S. Application Data (63) Continuation-in-part of application No. 16/245,690, filed on Jan. 11, 2019.

(51) Int. Cl.
H05K 7/18 (2006.01)
A47B 57/54 (2006.01)
(Continued)

(52) U.S. Cl.
CPC .............. H05K 7/183 (2013.01); A47B 57/38 (2013.01); A47B 57/406 (2013.01);
(Continued)

(58) Field of Classification Search
CPC ........ H05K 7/183; H05K 7/1489; H05K 7/14; H05K 7/1421; A47B 57/38; A47B 57/545; A47B 88/43; A47B 96/07; A47B 57/485; A47B 88/49; A47B 88/57; A47B 2210/0018; A47B 2210/0059; A47B 2210/0016; A47B 88/493; A47B 2210/0081; A47B 2088/4235; A47B 2210/0032; A47B 2210/007; A47B 2210/0035; A47B 88/477; A47B 88/40; A47B 88/44; A47B 96/06; A47B 57/482; A47B 57/487; A47B 57/48; A47B 57/50; A47B 57/406; A47B 47/0083; A47B 57/20; A47B 57/40
USPC ......... 211/26, 192, 187, 183, 191, 103, 186, 211/190, 208; 312/334.4, 333, 334.1, 312/334.7, 334.8, 223.1, 330.1, 334.44, 312/265.1, 265.4, 334.27, 334.46;
(Continued)

(56) References Cited

U.S. PATENT DOCUMENTS

6,929,339 B1 *  8/2005  Greenwald .......... H05K 7/1421
                                              211/26
7,357,362 B2 *  4/2008  Yang .................... H05K 7/1489
                                              248/220.22
(Continued)

*Primary Examiner* — Hiwot E Tefera
(74) *Attorney, Agent, or Firm* — Alan D. Kamrath; Mayer & Williams PC (57) ABSTRACT

A securing device for slide rails of a servo cabinet includes a slide rail assembly and an end unit is connected to a distal end of the rail assembly. A hook unit is connected to the inside of the rail assembly and includes a hook which is pivotably connected to the rail assembly and extends through a slit of the end unit to hook to a rack post. An operation unit includes a block movably located in a groove formed on the inside of the rail assembly and biased by a spring. A tail end of the hook contacts either a top face or an inclined face defined in the top of the block so as to be positioned to hook to different shapes of holes of the rack post. The hook is released from the holes of the rack post when the block is pushed toward the end unit.

2 Claims, 14 Drawing Sheets

(51) Int. Cl.
*A47B 57/38* (2006.01)
*A47B 57/40* (2006.01)
*A47B 88/43* (2017.01)
*H05K 7/14* (2006.01)

(52) U.S. Cl.
CPC ............ *A47B 57/545* (2013.01); *A47B 88/43* (2017.01); *H05K 7/1489* (2013.01)

(58) Field of Classification Search
USPC .... 248/243, 250, 235, 220.21, 224.8, 218.4, 248/239, 221.11, 220.22, 223.41, 220.41
See application file for complete search history.

(56) References Cited

U.S. PATENT DOCUMENTS

| | | | | |
|---|---|---|---|---|
| 8,104,626 | B2* | 1/2012 | Huang | A47B 88/43 |
| | | | | 211/26 |
| 8,727,138 | B2* | 5/2014 | Dittus | H05K 7/183 |
| | | | | 211/26 |
| 2004/0108427 | A1* | 6/2004 | Chen | A47B 57/40 |
| | | | | 248/244 |
| 2014/0132139 | A1* | 5/2014 | Chang | H05K 7/183 |
| | | | | 312/333 |
| 2018/0084908 | A1* | 3/2018 | Chen | H05K 7/183 |
| 2018/0199712 | A1* | 7/2018 | Chen | A47B 88/43 |

\* cited by examiner

Fig.1-1

PRIOR ART

Fig.1-2

PRIOR ART

Fig.1-3

PRIOR ART

SECURING DEVICE FOR SLIDE RAIL OF SERVO CABINET

BACKGROUND OF THE INVENTION

Fields of the Invention

The present invention is a Continuation-In-Part application of U.S. patent application Ser. No. 16/245,690, filed on Jan. 11, 2019.

DESCRIPTIONS OF RELATED ART

The conventional servo cabinet is able to accommodate multiple servos and equipment therein and the wires of the servos and equipment are well managed. There are multiple slide rails on two sides of the cabinet and the servos are supported between these slide rails. The slide rails can be pulled out to replace or maintain the servos conveniently. However, the movement of the servos changes weight center and the servos may fall out from the slide rails.

Figure 11:
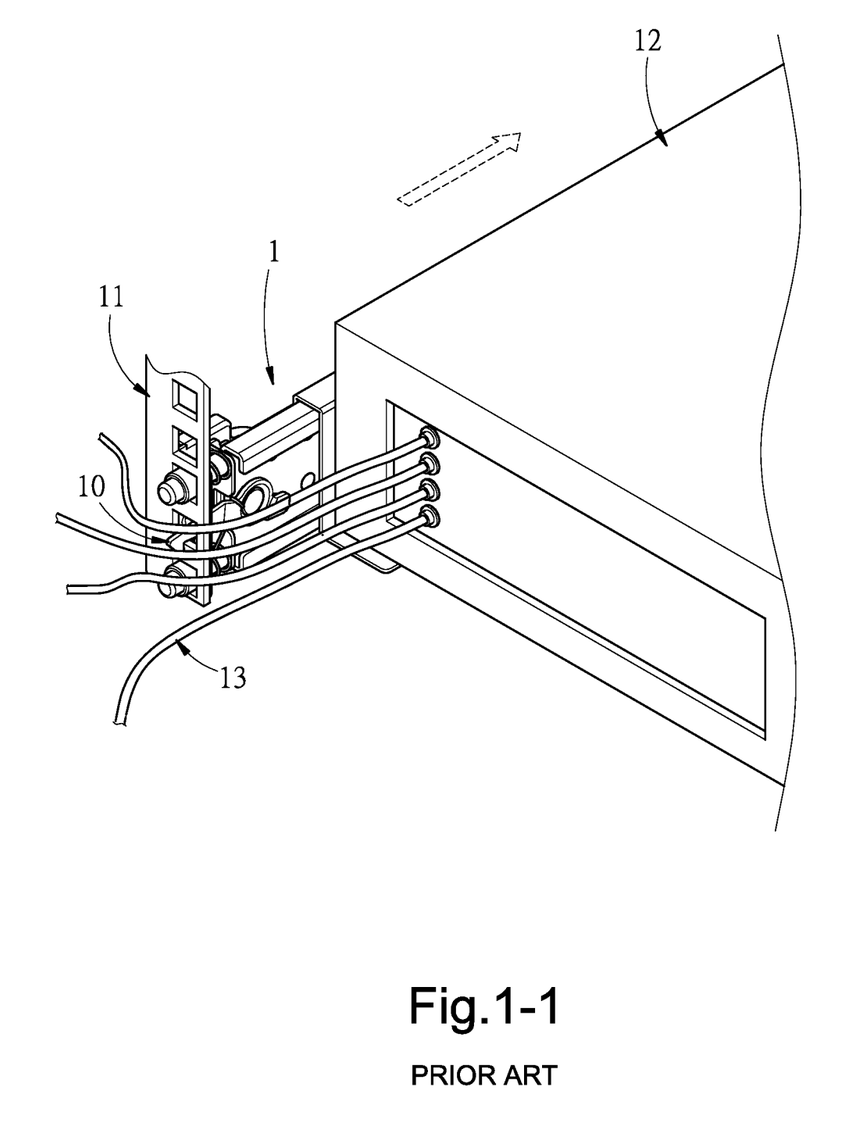
Figure 12:
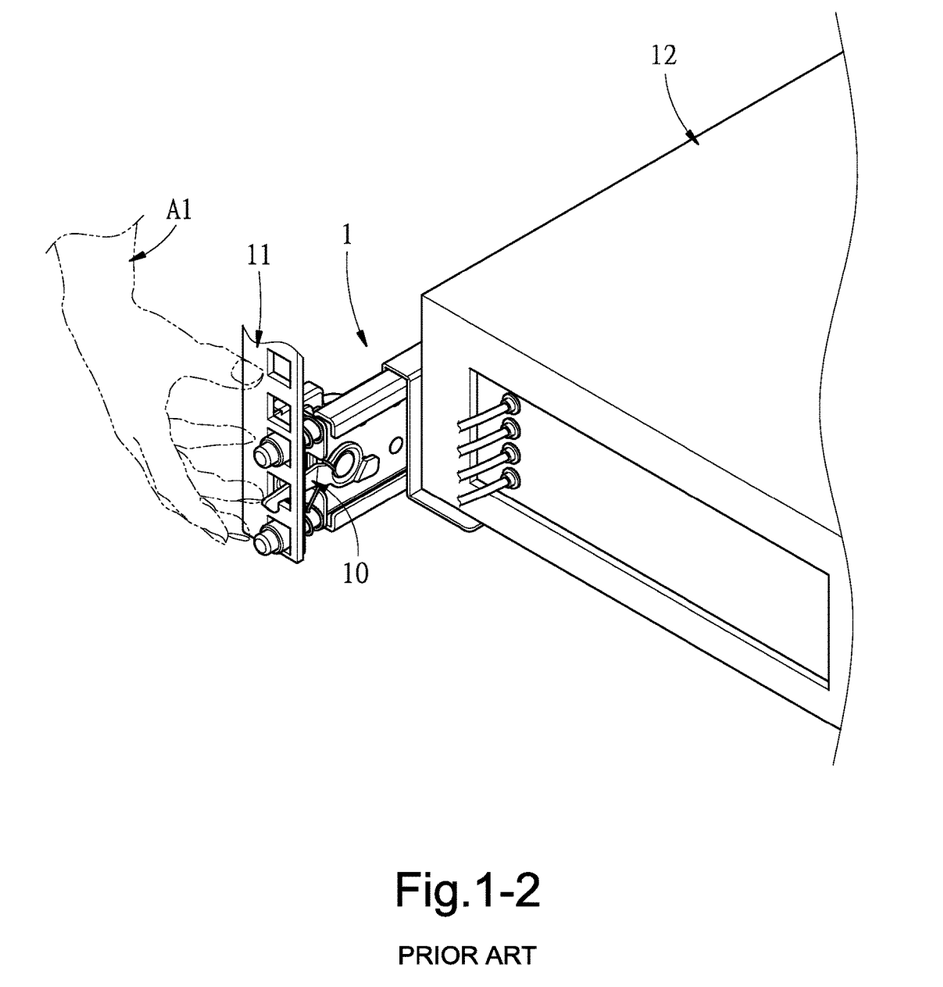
Figure 13:
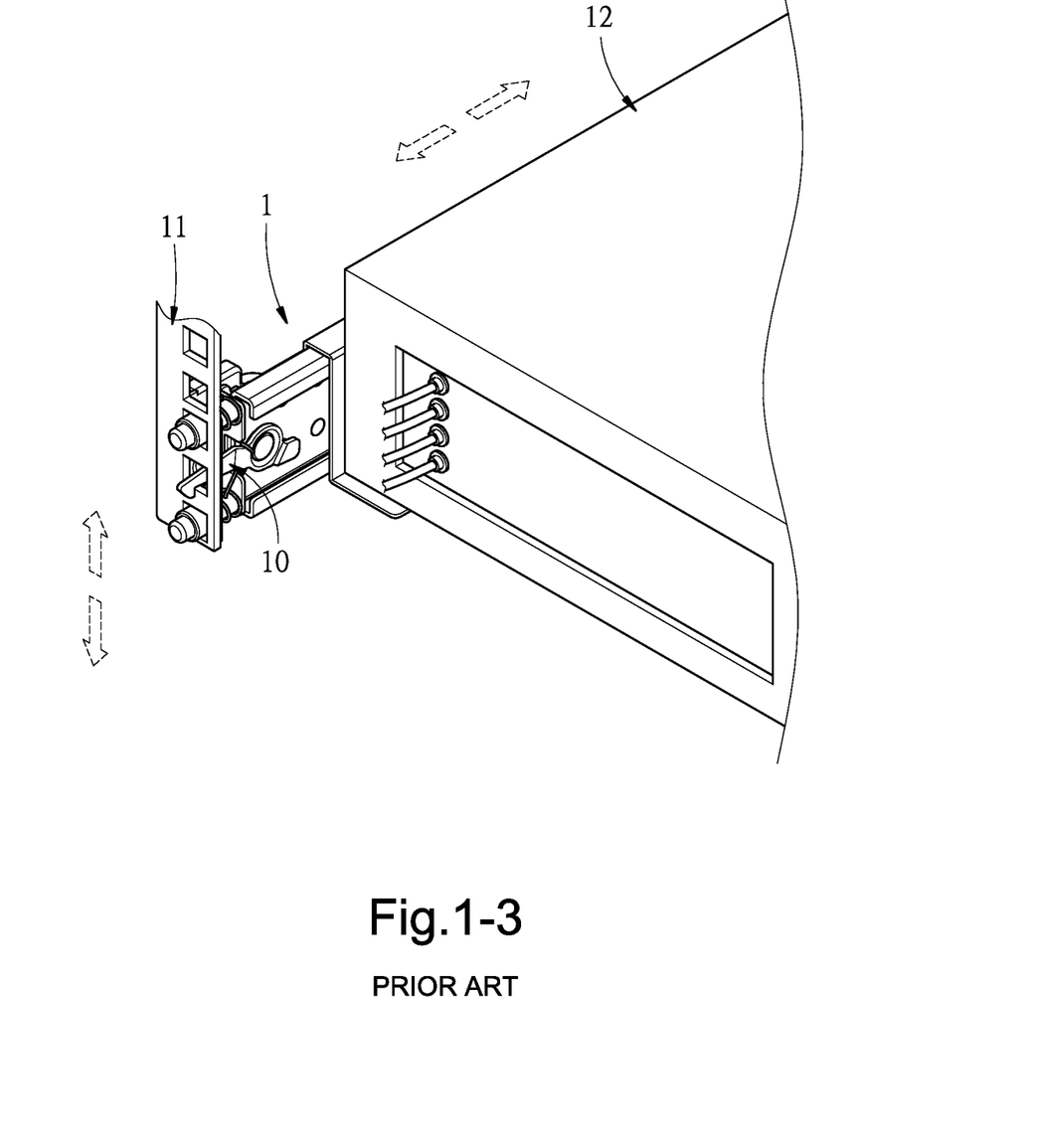
Figure 51:
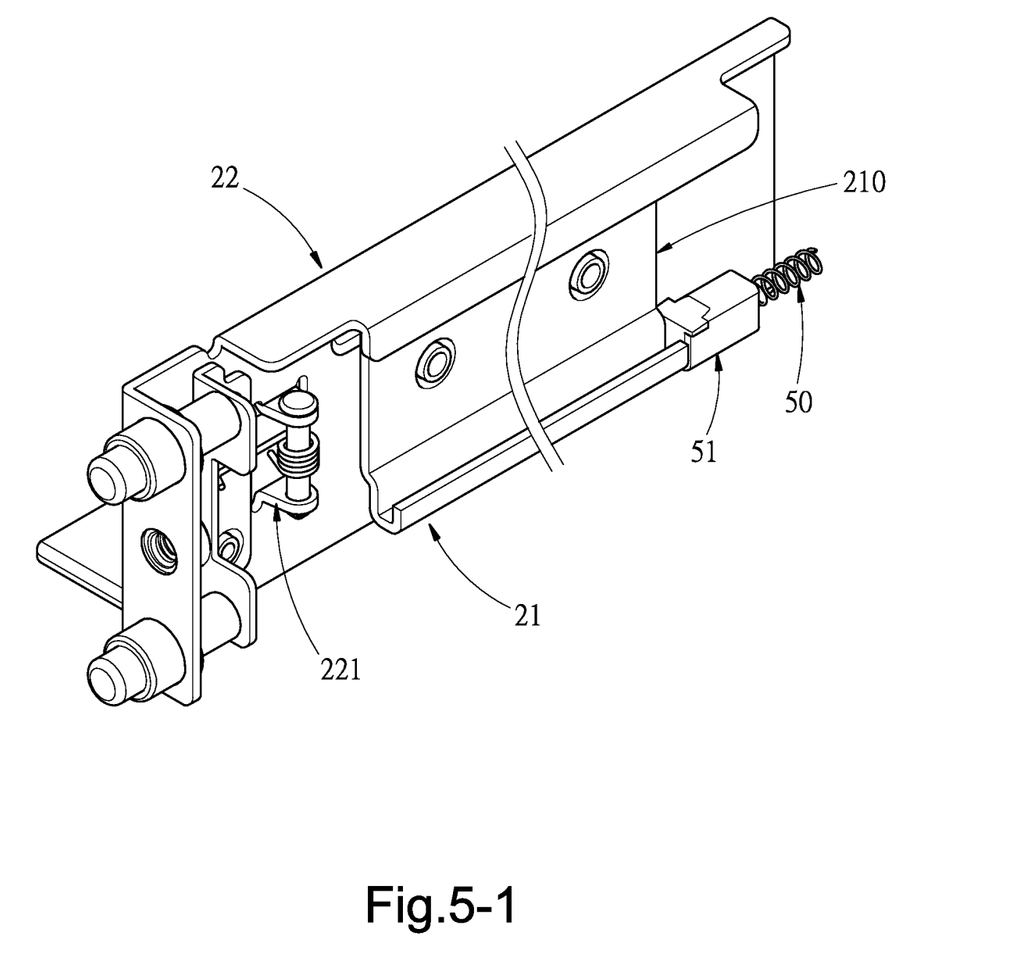

FIG. 1-1 discloses a servo 12 is supported on the slide rails 1 and the slide rails 1 are secured to the rack post 11. In order to secure the slide rails 1 to the rack post 11, a hook 10 is attached to the slide rails 1 and hooks to one of the holes of the rack post 11. The hook 10 may be unintentionally released from the hole by the wires 13 when sliding the servo 12. Furthermore, as disclosed in FIG. 1-2, the hook 10 may also be unintentionally released from the hole by users' hand A1. Moreover, vibration such as earth quack may also release the hook 10 as shown in FIG. 1-3.

The present invention intends to provide a securing device for slide rails of a servo cabinet, wherein the hook is prevented from being released by the securing device to eliminate the shortcomings mentioned above.

SUMMARY OF THE INVENTION

The present invention relates to a securing device for slide rails of a servo cabinet, and comprises a slide rail assembly having a first rail, a second rail and a third rail. The first rail includes a groove defined axially to inside thereof, and a slot is defined axial through the first rail. The second rail is riveted to the third rail and slidably engaged with the groove of the first rail. The third rail includes a support plate extending from one side thereof so as to support a servo or the like. An end unit is connected to one distal end of the first rail and includes a connection plate, two protrusions and two first springs. The connection plate is an L-shaped plate and includes a slit defined therein which is located corresponding to the distal end of the first rail. The two protrusions extend through the connection plate, and the slit is located between the two protrusions. The two first springs are respectively mounted to the two protrusions and biased between the connection plate and the distal end of the first rail. Each protrusion includes a first section and a second section which is integrally and axially formed with the first section. The first and second sections are different in size. A hook unit is connected to the inside of the first rail and includes a second spring, a hook and a pin. The pin extends through the hook and is connected to a bore defined through the first rail so as to pivotably connect the hook to the inside of the first rail. The second spring is biased between the connection plate and the hook so that the hook is pivotable about the pin. The hook includes a hooking end and a tail end, wherein the hooking end extends through the slit of the connection plate and hooks to one of rectangular holes or round holes of the rack post. An operation unit is movably located in the groove of the first rail and includes a third spring and a block. The block is movably located in the groove and the third spring is axially biased between one distal end of the block and the connection plate. The block has a guide plate which is slidably engaged with the slot to guide the block to move linearly along the slot. The tail end of the hook detachably contacts the top of the block, and the end face of the second rail detachably contacts the block.

Preferably, the block includes a top face and an inclined face respectively defined in the top thereof. When the tail end of the hook contacts the top face of the block, the hooking end of the hook is engaged with one of rectangular hole of the rack post. When the tail end of the hook contacts the inclined face of the block, the hooking end of the hook is engaged with one of round hole of the rack post.

The primary object of the present invention is to provide a securing device which ensures that the hook does not released from the rack post except for operation to the operation unit.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIGS. 1-1, 1-2 and 1-3 respectively show situations that cause the hook to be unintentionally released from the rack post;

FIG. 5-1 shows that second rail contacts the block of the operation unit;

FIG. 5-2 shows that second rail pushes the block of the operation unit toward the end unit, and the rail end of the hook is removed from the top of the block;

FIG. 5-3 is an enlarged view of the circled portion in FIG. 5-2;

FIG. 7-1 shows that the tail end of the hook contacts the top face of the block in FIG. 7;

FIG. 8-1 shows that the tail end of the hook contacts the inclined face of the block in FIG. 8.

DETAILED DESCRIPTION OF THE PREFERRED EMBODIMENT

Referring to FIGS. 2 to 4 and 5-1, the securing device for slide rails of a servo cabinet of the present invention comprises a slide rail assembly 1, an end unit 3, a hook unit 4 and an operation unit 5. The slide rail assembly 1 comprises a first rail 20, a second rail 21 and a third rail 22. The first rail 20 includes a bent portion extending from two sides of the inside thereof, and each bent portion forms a groove 201 defined axially to the inside of the first rail 20. A slot 202 is defined axial through the first rail 20 and located close to one distal end of the first rail 20. The second rail 21 is riveted to the third rail 22 and slidably engaged with the groove 201 of the first rail 20. The third rail 22 includes a support plate 220 extending from one side thereof so as to support a servo or the like.

The end unit 3 is connected to the distal end of the first rail 20 mentioned above, and includes a connection plate 30, two protrusions 31 and two first springs 32. The connection plate 30 is an L-shaped plate and includes a slit 300 defined therethrough which is located corresponding to the distal end of the first rail 20 mentioned above. The two protrusions 31 extend through the connection plate 30, and the slit 300 is located between the two protrusions 31. The two first springs 32 are respectively mounted to the two protrusions 31 and biased between the connection plate 30 and the distal end of the first rail 20. Each protrusion 31 includes a first section 310 and a second section 311 which is integrally and axially formed with the first section 310. The first and second sections 310, 311 are different in size so as to be connected to the rack post 6.

The hook unit 4 is connected to the inside of the first rail 20 and includes a second spring 40, a hook 41 and a pin 42. The pin 42 extends through the hook 41 and is connected to a bore 200 defined through the first rail 20 so as to pivotably connect the hook 41 to the inside of the first rail 20. The bore 200 is located above the slot 202. The second spring 40 is a torsion and includes two legs. The second spring 40 is respectively biased between the connection plate 30 and the hook 41 so that the hook 41 is pivotable about the pin 42. The hook 41 includes a hooking end and a tail end, wherein the hooking end extends through the slit 300 of the connection plate 30 and hooks to one of rectangular holes or round holes of the rack post 6. The second spring 40 provides a force to keep the hooking end hooking downward to hook to one of the rectangular holes or the round holes of the rack post 6.

Figure 71:
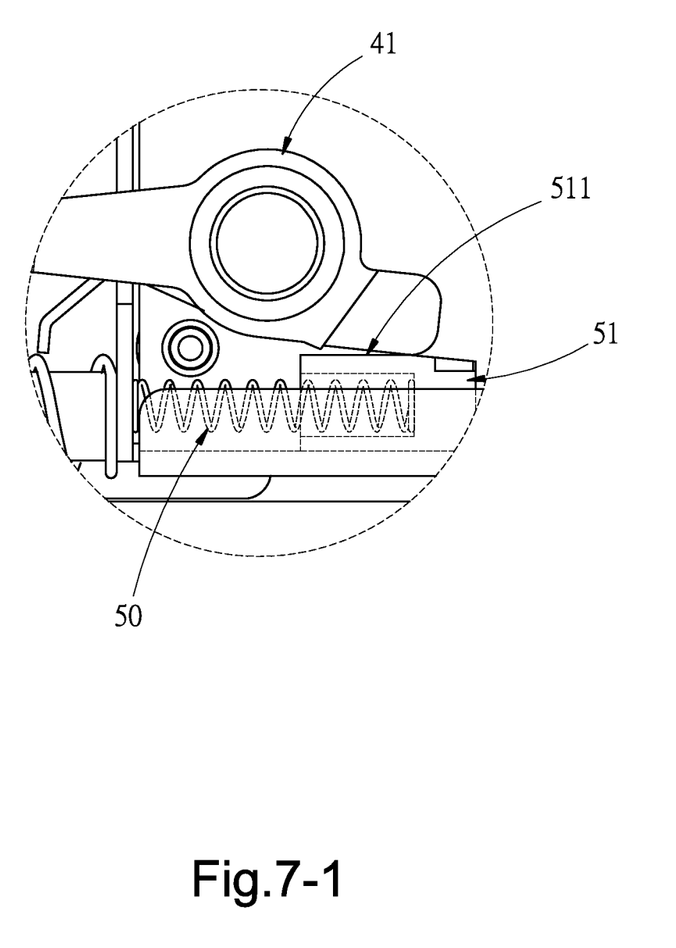
Figure 81:
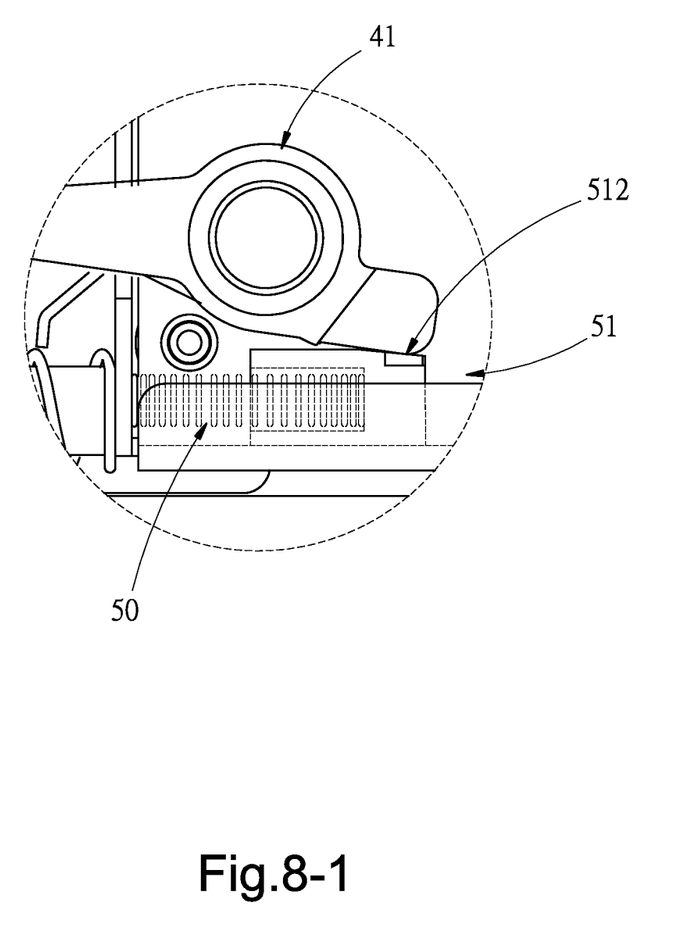

The operation unit 5 is movably located in the groove 201 of the first rail 20 and includes a third spring 50 and a block 51. The block 51 is movably located in the groove 201 and the third spring 50 is axially biased between the front end of the block 50 and the connection plate 30. The block 51 has a guide plate 510 which is slidably engaged with the slot 202 to guide the block 51 to move linearly along the slot 202. The tail end of the hook 41 detachably contacts the top of the block 51, and the end face 210 of the second rail 21 detachably contacts the rear end of the block 51. Specifically, the block 51 includes a top face 511 and an inclined face 512 respectively defined in the top thereof as shown in FIGS. 7-1 and 8-1.

Figure 2:
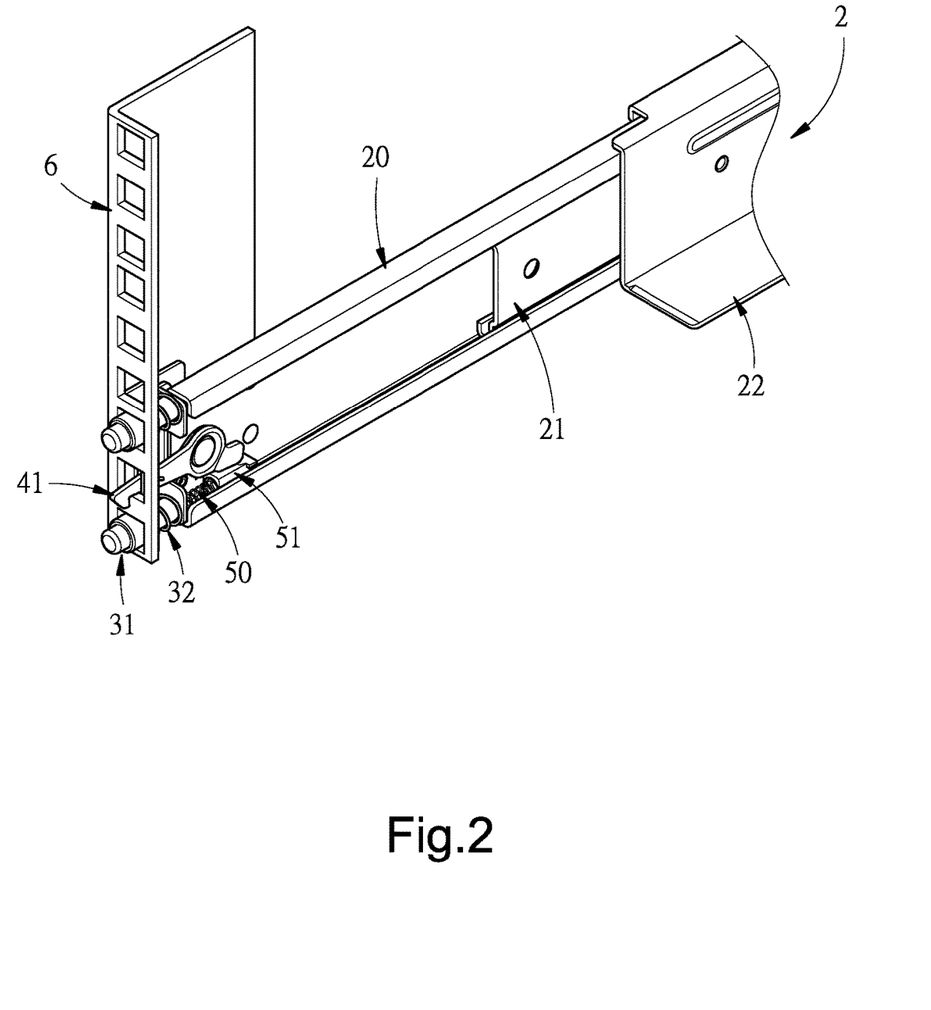
FIG. 2 is a perspective view to show the securing device of the present invention.
Figure 3:
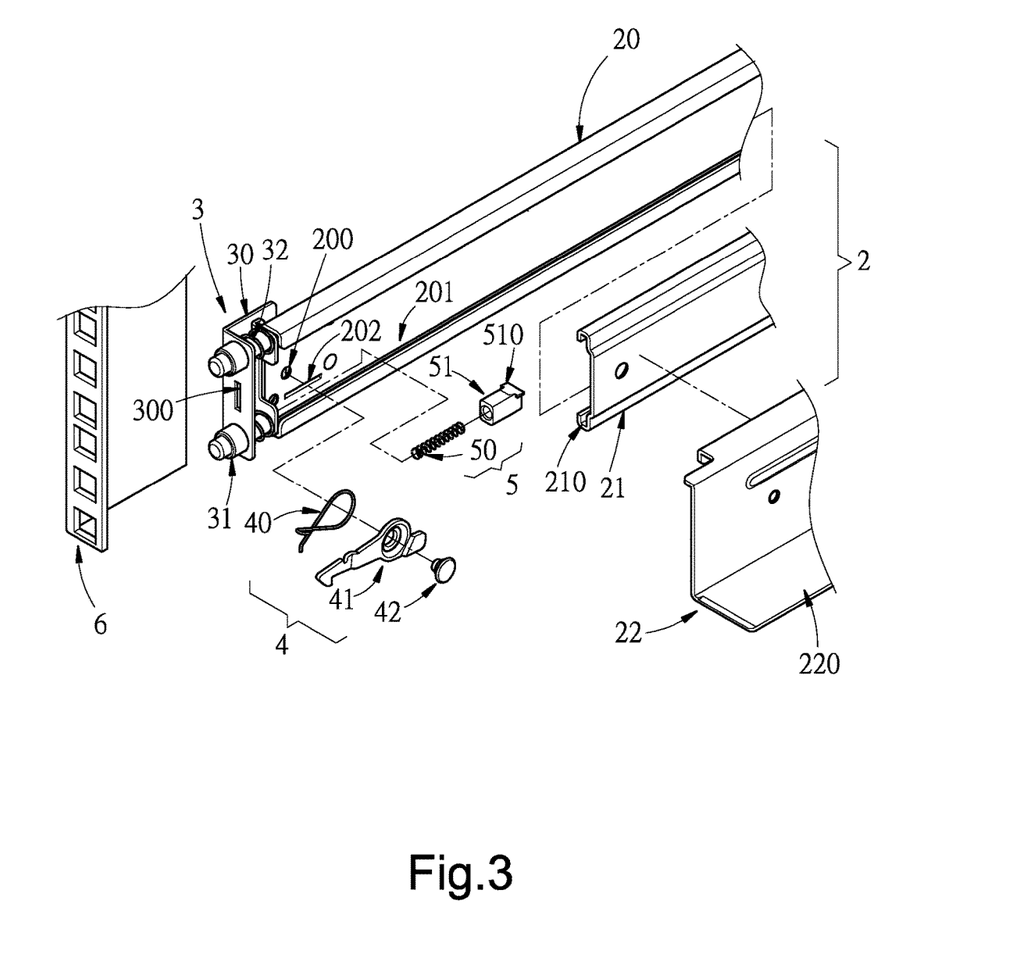
FIG. 3 is an exploded view to show the securing device of the present invention.
Figure 4:
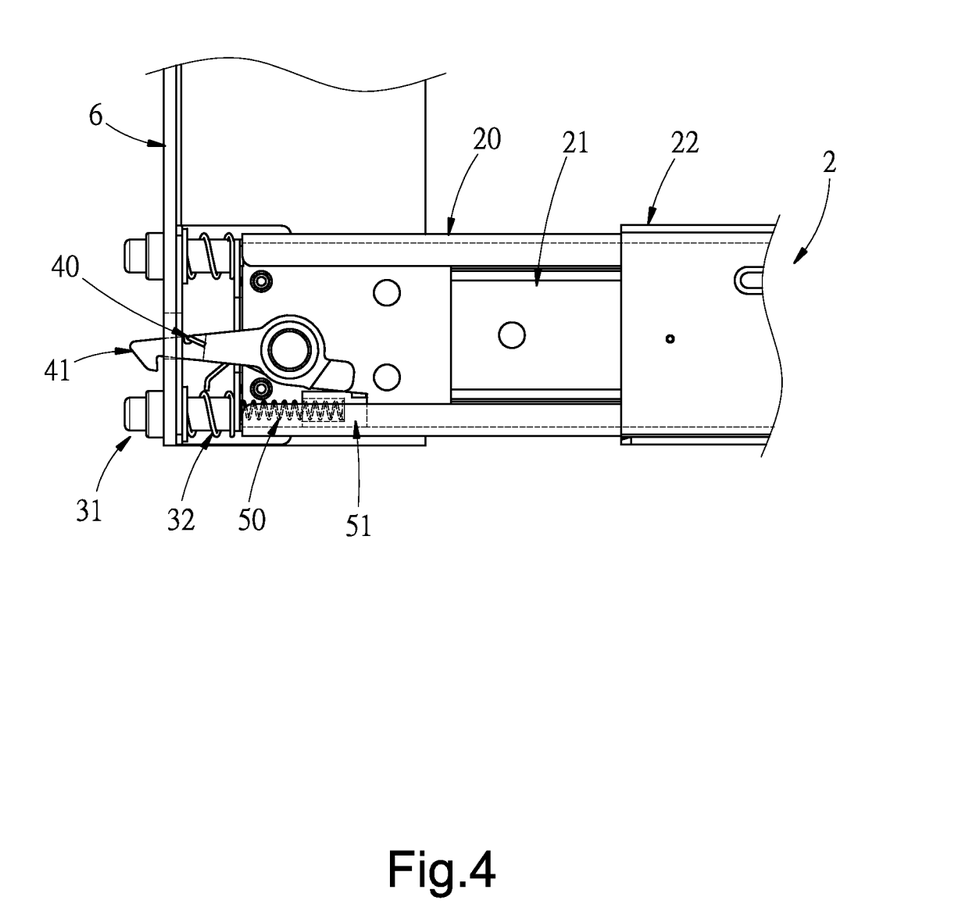
FIG. 4 shows that the rail end of the hook contacts the top of the block of the operation unit of the securing device of the present invention.
Figure 7:
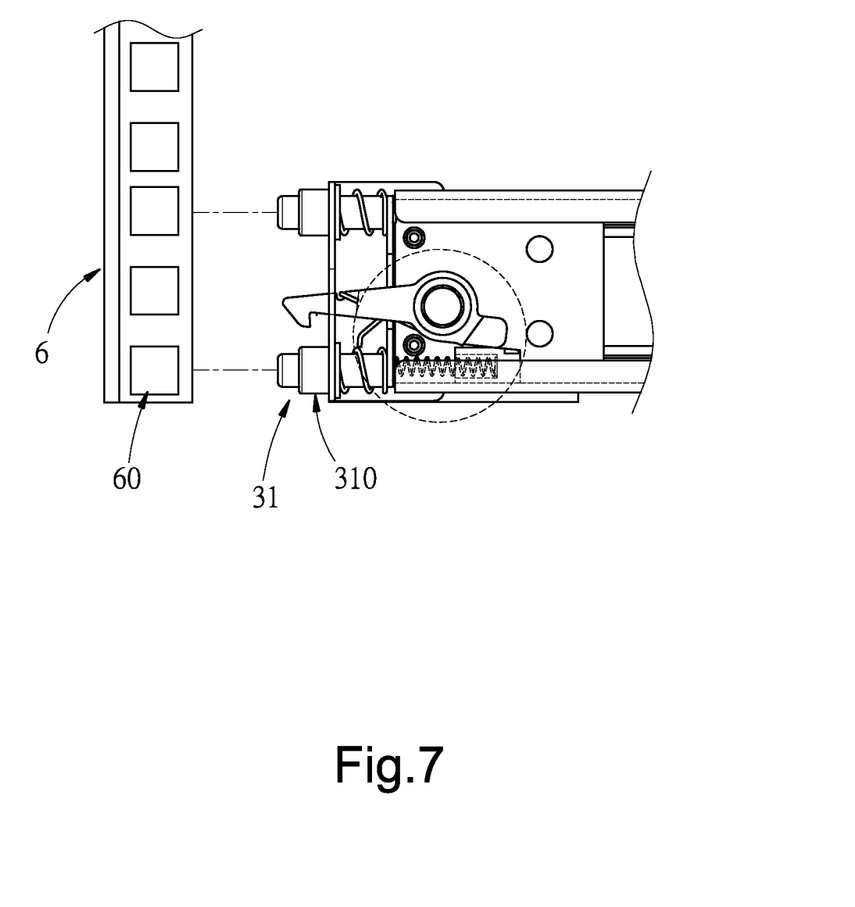
FIG. 7 shows that the hook is to be hooked to one of rectangular holes of the rack post.
Figure 8:
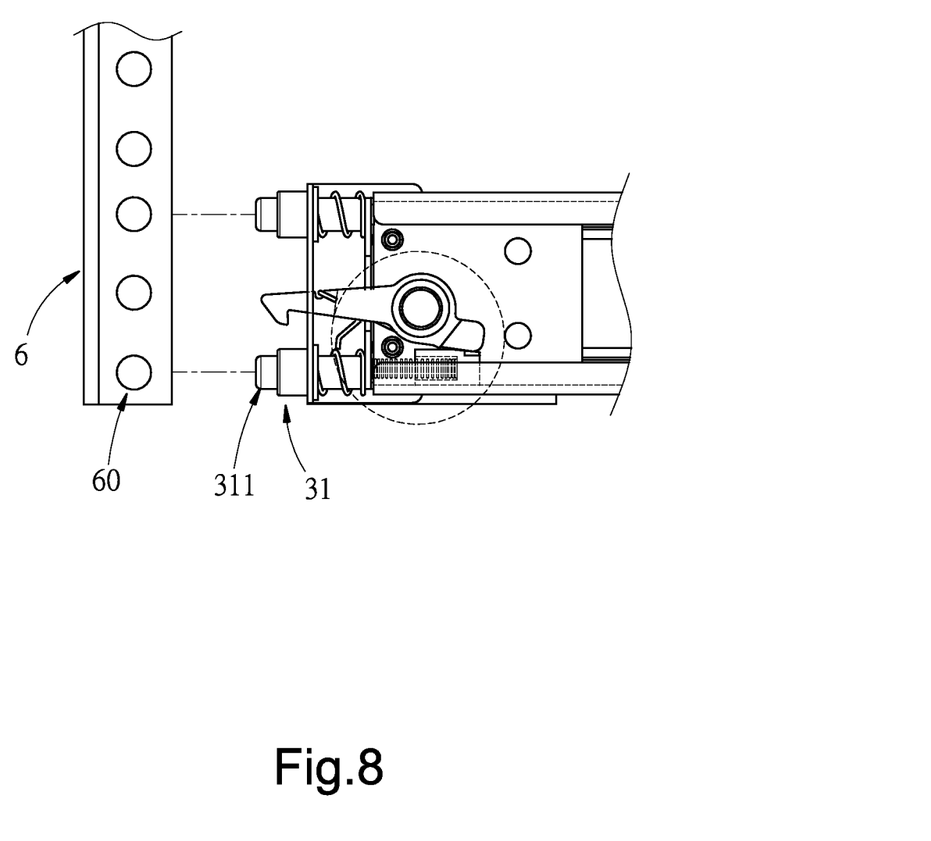
FIG. 8 shows that the hook is to be hooked to one of round holes of the rack post.

As shown in FIGS. 7 and 7-1, when the tail end of the hook 41 contacts the top face 511 of the block 51, the hooking end of the hook 41 is engaged with one of rectangular hole 60 of the rack post 6. The first section 310 of each protrusion 31 extends through the rectangular hole 60 corresponding thereto as shown in FIG. 2. As shown in FIGS. 8 and 8-1, when the tail end of the hook 41 contacts the inclined face 512 of the block 51, the hooking end of the hook 41 is engaged with one of round hole 61 of the rack post 6. The second section 311 of each protrusion 31 extends through the round hole 61 corresponding thereto.

Figure 6:
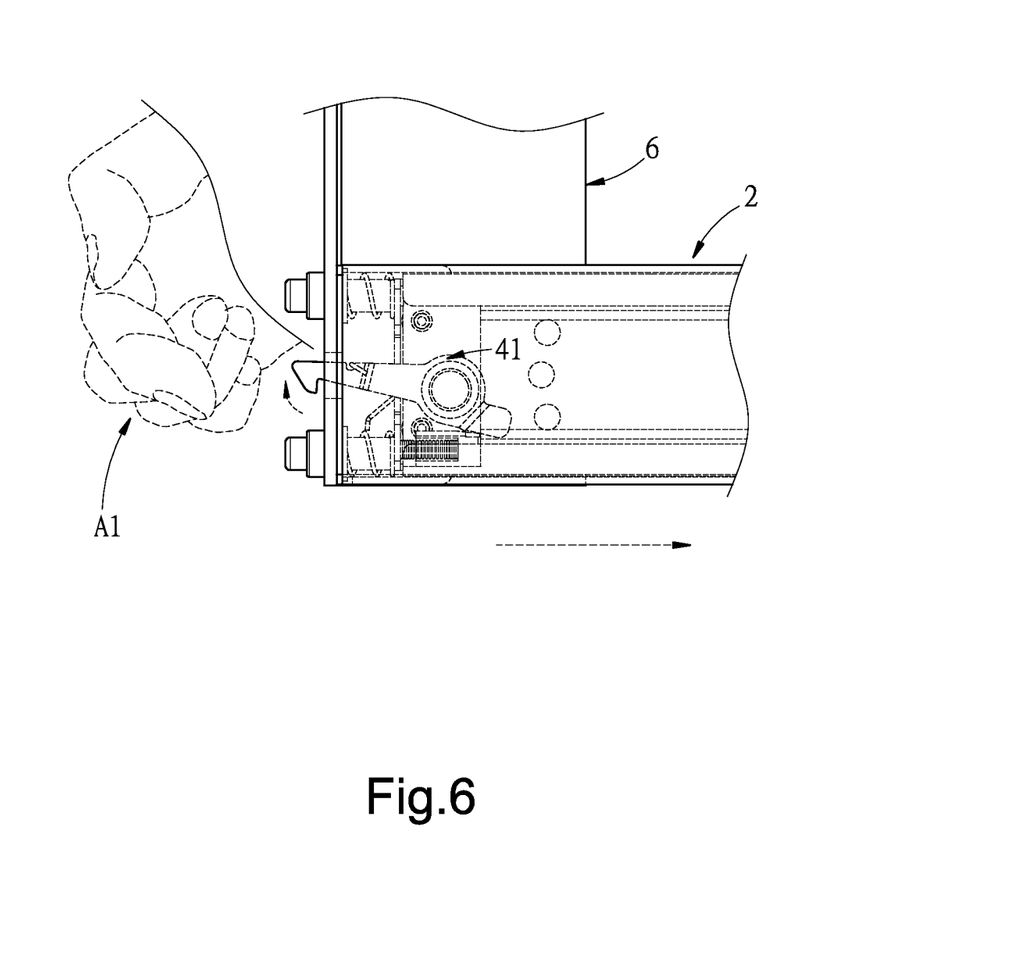
FIG. 6 shows that the user pivots the hook upward to release the hook from the rack post.
Figure 52:
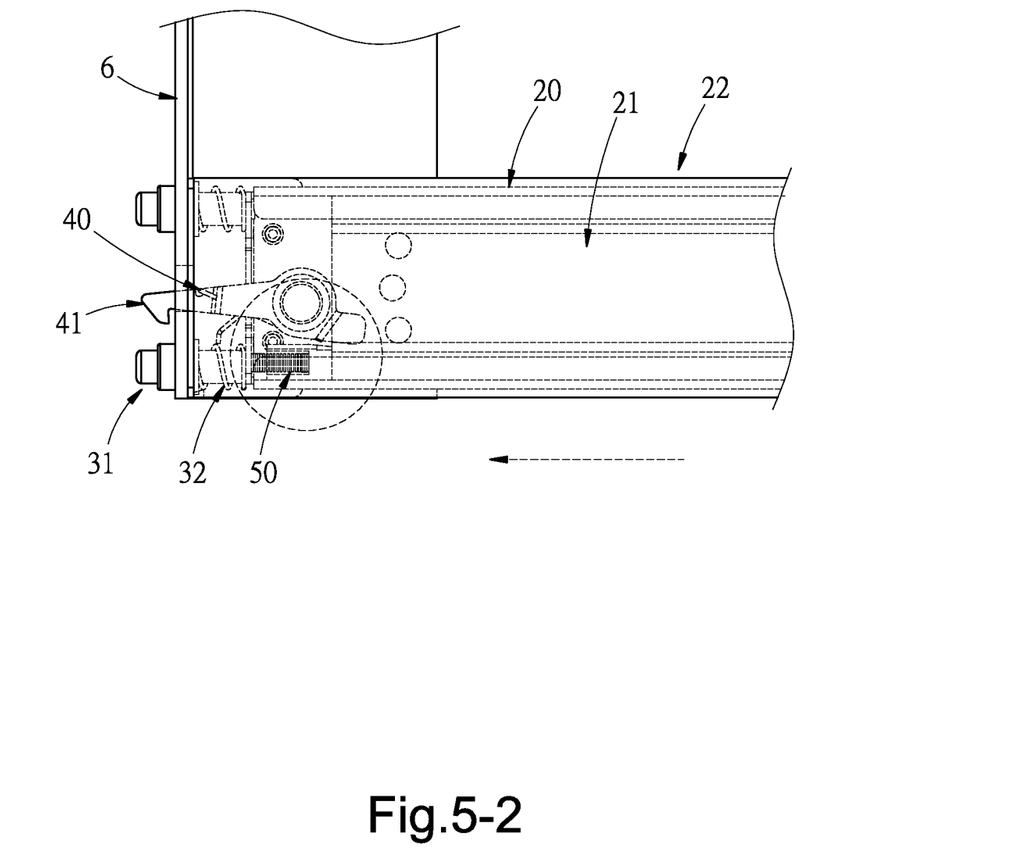
Figure 53:
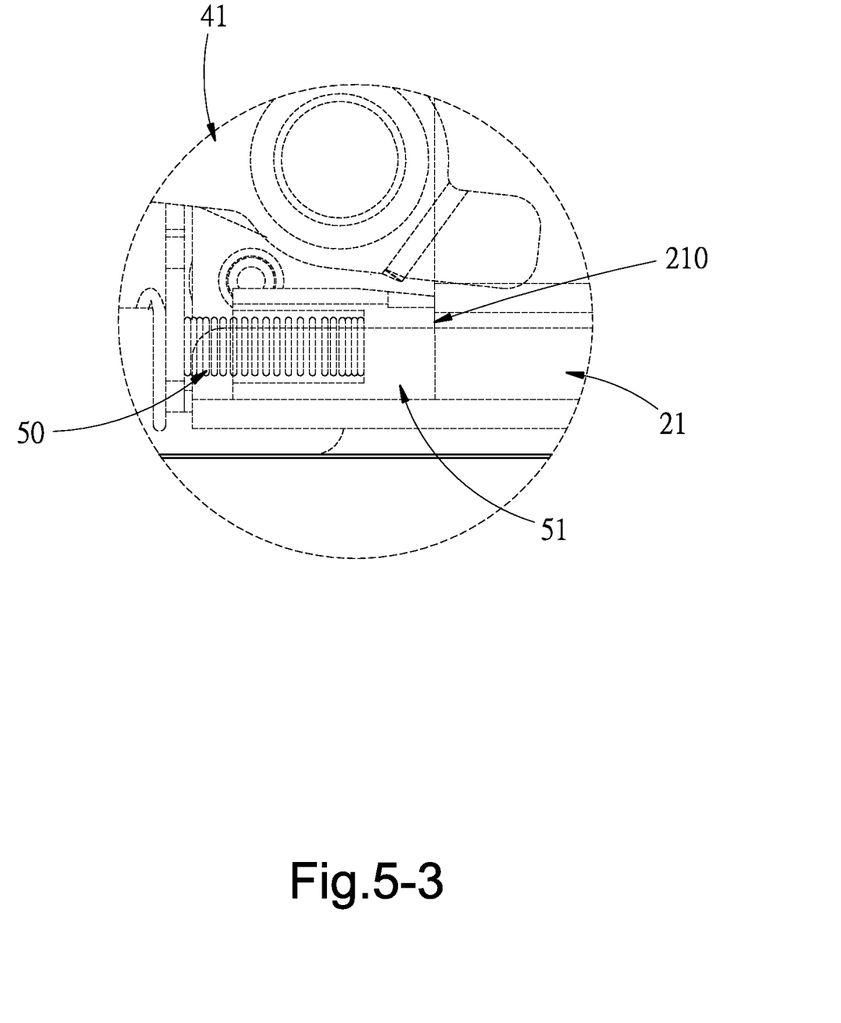

As shown in FIGS. 5-2, 5-3 and 6, when releasing the hook 41 from the rack post 6, the second rail 21 is slid toward the rear end of the block 51 and pushes the block 51 a distance to compress the third spring 50. The tail end of the hook 41 is separated from the top of the block 51. That is to say, the tail end of the hook 41 is not supported by the top of the block 51, and the hook 41 can be pivoted a larger angle. A user may pivot the hook 41 upward as shown in FIG. 6 and the hooking end is moved upward such that the slide rail assembly 1 can be separated from the rack post 6.

The hook 41 cannot be separated from the rack post 6 if the block 51 is not moved to compress the third spring 50. This ensures that the slide rail assembly 1 always secured to the rack post 6.

While we have shown and described the embodiment in accordance with the present invention, it should be clear to those skilled in the art that further embodiments may be made without departing from the scope of the present invention.

What is claimed is:

1. A securing device for slide rails of a servo cabinet, comprising:

a slide rail assembly having a first rail, a second rail and a third rail, the first rail including a groove defined axially to an inside thereof, a slot defined axial through the first rail, the second rail being connected to the third rail and slidably engaged with the groove of the first rail, the third rail including a support plate extending from one side thereof;

an end unit connected to a distal end of the first rail and including a connection plate, two protrusions and two first springs, the connection plate including a slit defined therein which is located corresponding to the distal end of the first rail, the two protrusions extend through the connection plate, the slit located between the two protrusions, the two first springs respectively mounted to the two protrusions and biased between the connection plate and the distal end of the first rail, each protrusion including a first section and a second section which is integrally and axially formed with the first section;

a hook unit connected to the inside of the first rail and including a second spring, a hook and a pin, the pin extending through the hook and connected to a bore defined through the first rail to pivotably connect the hook to the inside of the first rail, the second spring biased between the connection plate and the hook so that the hook is pivotable about the pin, the hook including a hooking end and a tail end, the hooking end extending through the slit of the connection plate and hooking to a rack post, and an operation unit movably located in the groove of the first rail and including a third spring and a block, the block movably located in the groove and the third spring biased between an end of the block and the connection plate, the block having a guide plate which is slidably engaged with the slot to guide the block to move linearly along the slot, the tail end of the hook detachably contacting a top of the block, and an end face of the second rail detachably contacting the block.

2. The securing device as claimed in claim 1, wherein the block includes a top face and an inclined face respectively defined in the top thereof, when the tail end of the hook contacts the top face of the block, the hooking end of the hook is engaged with one of rectangular hole of the rack post, when the tail end of the hook contacts the inclined face of the block, the hooking end of the hook is engaged with one of round hole of the rack post.

* * * * *